United States Patent
Marti et al.

(10) Patent No.: US 7,206,967 B1
(45) Date of Patent: *Apr. 17, 2007

(54) CHIP DEBUGGING USING INCREMENTAL RECOMPILATION AND REGISTER INSERTION

(75) Inventors: Philippe Marti, Bucks (GB); Mark Jervis, Windsor (GB); Gregor Nixon, Bicester (GB)

(73) Assignee: Altera Corporation, San Jose, CA (US)

( * ) Notice: Subject to any disclaimer, the term of this patent is extended or adjusted under 35 U.S.C. 154(b) by 606 days.

This patent is subject to a terminal disclaimer.

(21) Appl. No.: 10/774,731

(22) Filed: Feb. 9, 2004

(51) Int. Cl.
*G06F 11/00* (2006.01)

(52) U.S. Cl. .......................... 714/25; 714/39

(58) Field of Classification Search .................. 714/25, 714/39, 725, 733, 724; 716/18; 717/131; 703/16

See application file for complete search history.

(56) References Cited

U.S. PATENT DOCUMENTS

| | | |
|---|---|---|
| 4,696,004 A | 9/1987 | Nakajima |
| 4,788,492 A | 11/1988 | Schubert |
| 4,835,736 A | 5/1989 | Easterday |
| 4,847,612 A | 7/1989 | Kaplinsky |
| 4,873,459 A | 10/1989 | El Gamo et al. |
| 5,036,473 A | 7/1991 | Butts et al. |
| 5,058,114 A | 10/1991 | Kuboki et al. |
| 5,124,588 A | 6/1992 | Baltus et al. |
| 5,329,470 A | 7/1994 | Sample et al. |
| 5,365,165 A | 11/1994 | El-Ayat et al. |
| 5,425,036 A | 6/1995 | Liu et al. |
| 5,452,231 A | 9/1995 | Butts et al. |
| 5,568,437 A | 10/1996 | Jamal |
| 5,572,712 A | 11/1996 | Jamal |

(Continued)

FOREIGN PATENT DOCUMENTS

DE 4042262 7/1992

(Continued)

OTHER PUBLICATIONS

Marantz, Joshua, "Enhanced Visibility and Performance in Functional Verification by Reconstruction", Proceedings of the 35th Annual Conference on Design Automation Conference, pp. 164-169. 1998.

(Continued)

*Primary Examiner*—Dieu-Minh Le
(74) *Attorney, Agent, or Firm*—Beyer Weaver LLP

(57) ABSTRACT

While debugging, a user chooses an incremental recompile. Internal signals of interest and output pins are selected, and a number of additional registers are chosen to insert in the path of each internal signal. A clock is selected for the registers. An incremental recompile of the compiled design compiles a routing from each internal signal to an output pin via the added registers. The database building and logic synthesis stages are skipped. The post-fitting logical netlist and routing netlist are retrieved. The new registers are created and the internal signal is connected to the output pin atom in the logical netlist. The fitter places and routes the connections to create a new routing netlist and then the new routing netlist is output into a programming output file (POF) in a form suitable for programming the PLD. The original routing netlist is undisturbed. The user views the internal signals at the output pins chosen. The user may iterate through this process many times in order to debug the PLD. The debugging assignments may be deleted.

33 Claims, 11 Drawing Sheets

U.S. PATENT DOCUMENTS

| | | | |
|---|---|---|---|
| 5,629,617 | A | 5/1997 | Uhling et al. |
| 5,640,542 | A | 6/1997 | Whitsel et al. |
| 5,661,662 | A | 8/1997 | Butts et al. |
| 5,717,695 | A | 2/1998 | Manela et al. |
| 5,717,699 | A | 2/1998 | Haag et al. |
| 5,764,079 | A | 6/1998 | Patel et al. |
| 5,821,771 | A | 10/1998 | Patel et al. |
| 5,870,410 | A | 2/1999 | Norman et al. |
| 5,937,190 | A | 8/1999 | Gregory et al. |
| 5,949,692 | A * | 9/1999 | Beausang et al. ............. 716/18 |
| 5,960,191 | A | 9/1999 | Sample et al. |
| 5,983,277 | A | 11/1999 | Heile et al. |
| 6,002,861 | A | 12/1999 | Butts et al. |
| 6,014,334 | A | 1/2000 | Patel et al. |
| 6,016,563 | A | 1/2000 | Fleisher |
| 6,020,758 | A | 2/2000 | Patel et al. |
| 6,104,211 | A | 8/2000 | Alfke |
| 6,106,568 | A * | 8/2000 | Beausang et al. ............. 716/18 |
| 6,107,821 | A | 8/2000 | Kelem et al. |
| 6,157,210 | A | 12/2000 | Zaveri et al. |
| 6,167,561 | A | 12/2000 | Chen et al. |
| 6,182,247 | B1 | 1/2001 | Herrmann et al. |
| 6,195,788 | B1 | 2/2001 | Leaver et al. |
| 6,212,650 | B1 | 4/2001 | Guccione |
| 6,223,148 | B1 | 4/2001 | Stewart et al. |
| 6,247,147 | B1 | 6/2001 | Beenstra et al. |
| 6,259,271 | B1 | 7/2001 | Couts-Martin et al. |
| 6,263,484 | B1 | 7/2001 | Yang |
| 6,286,114 | B1 | 9/2001 | Veenstra et al. |
| 6,311,317 | B1 * | 10/2001 | Khoche et al. ............... 716/18 |
| 6,317,860 | B1 | 11/2001 | Heile |
| 6,321,369 | B1 | 11/2001 | Heile et al. |
| 6,389,558 | B1 | 5/2002 | Herrmann et al. |
| 6,393,591 | B1 | 5/2002 | Jenkins et al. |
| 6,405,355 | B1 * | 6/2002 | Duggirala et al. ............. 716/8 |
| 6,434,733 | B1 * | 8/2002 | Duggirala et al. ............. 716/11 |
| 6,460,148 | B2 | 10/2002 | Veenstra et al. |
| 6,481,000 | B1 | 11/2002 | Zaveri et al. |
| 6,490,717 | B1 | 12/2002 | Pedersen et al. |
| 6,631,520 | B1 | 10/2003 | Theron et al. |
| 6,704,889 | B2 | 3/2004 | Veenstra et al. |
| 6,754,862 | B1 | 6/2004 | Hoyer et al. |
| 6,766,501 | B1 * | 7/2004 | Duggirala et al. ............. 716/11 |
| 6,794,896 | B1 | 9/2004 | Brebner |
| 6,839,874 | B1 | 1/2005 | Fang |
| 6,842,865 | B2 | 1/2005 | Nee et al. |
| 6,891,397 | B1 | 5/2005 | Brebner |
| 6,911,841 | B2 | 6/2005 | Lee et al. |
| 6,973,405 | B1 | 12/2005 | Ansari |
| 7,020,598 | B1 | 3/2006 | Jacobson |
| 7,024,327 | B1 | 4/2006 | Dastidar et al. |
| 7,076,751 | B1 * | 7/2006 | Nixon et al. ................... 716/5 |
| 2003/0110430 | A1 | 6/2003 | Bailis et al. |

OTHER PUBLICATIONS

Stroud, Charles et al., "Evaluation of FPGA Resources for Built-in Self-test of Programmable Logic Blocks", Proceedings of the 1996 ACM 4th International Symposium on Field-programmable Gate Arrays, p. 107. 1996.

Collins, Robert R., "Overview of Pentium Probe Mode", (www.x86.org/ariticles/problemd/ProbeMode.htm), Aug. 21, 1998, 3 pgs.

Collins, Robert R., "ICE Mode and the Pentium Processor", (www.x86.org/ddj/Nov97/Nov97.htm), Aug. 21, 1986, 6 pgs.

"PentiumPro Family Developer's Manual", vol. 1: Specifications, Intel®Corporation, 1996, 9 Pgs.

"Pentium® Processor User's Manual", vol. 1, Intel®Corporation, 1993, pp. 3-11.

Xilinx, Inc.; ISE Logic Design Tools: ChipScope.

Synplicity, Inc. "Identify™RTL Debugger" 2003; p. 1-2.

Altera, SignalTap Analysis in the Quartus II Software Version 2.0; Sep. 2002, ver. 2.1; Altera Corporation.

Praveen K. Jaini and Nur A. Touba; "Observing Test Response of Embedded Cores through Surround Logic"; 1999 IEEE.

Nur A. Touba and Bahram Pouya; "Testing Embedded Cores Using Partial Isolation Rings"; 1997 IEEE.

* cited by examiner

Debugging Example

Timing Report Table

| | Source Name | Pin Location | Pin Name | Enable | Status | Delay (ns) |
|---|---|---|---|---|---|---|
| 1 | reg2 | Pin_H35 | sp2 | On | Routed | 8.786 ns |
| 2 | reg1 | Pin_U26 | sp1 | On | Routed | 8.747 ns |
| 3 | pin_o0 | Pin_P27 | sp_test | On | Routed | 5.808 ns |
| 4 | reg0 | Pin_F35 | Sp0 | On | Routed | Registered |
| 5 | reg3 | Pin_H34 | Sp3 | On | Routed | Registered |
| 6 | reg4 | Pin_U27 | Sp4 | On | Routed | Registered |
| 7 | reg5 | Pin_T27 | Sp5 | On | Routed | Registered |
| 8 | reg6 | Pin_G35 | Sp6 | On | Routed | Registered |
| 9 | reg7 | Pin_G34 | Sp7 | On | Routed | Registered |

- Compilation Report
  - Legal Notice
  - Flow Settings
  - Flow Elapsed Time
  - Flow Log
  - Analysis & Synthesis
  - Fitter
  - Assembler
  - Timing Analyzer
    - Timing Analyzer Settings
    - Timing Analyzer Summary
    - Clock Settings Summary
    - Clock Setup 'clk'
    - tsu
    - tco
    - tpd
    - th
    - Source to Output Delays
    - Minimum tco
    - Minimum tpd
    - Timing Analyzer IN Usage
    - Timing Analyzer Messages

FIG. 9

CHIP DEBUGGING USING INCREMENTAL RECOMPILATION AND REGISTER INSERTION

FIELD OF THE INVENTION

The present invention relates generally to analysis of a hardware device in connection with a computer system. More specifically, the present invention relates to routing signals within a programmable logic device for purposes of debugging.

BACKGROUND OF THE INVENTION

In the field of electronics various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

In the course of generating a design for a PLD, programming the PLD and checking its functionality on the circuit board or in the system for which it is intended, it is important to be able to debug the PLD because a design is not always perfect the first time. Before a PLD is actually programmed with an electronic design, a simulation and/or timing analysis may be used to debug the electronic design. Once the PLD has been programmed within a working system, however, it is also important to be able to debug the PLD in this real-world environment.

And although a simulation may be used to debug many aspects of a PLD, it is nearly impossible to generate a simulation that will accurately exercise all of the features of the PLD on an actual circuit board operating in a complex system. For example, a simulation may not be able to provide timing characteristics that are similar to those that will actually be experienced by the PLD in a running system; e.g., simulation timing signals may be closer or farther apart than what a PLD will actually experience in a real system.

In addition to the difficulties in generating a comprehensive simulation, circuit board variables such as temperature changes, capacitance, noise, and other factors may cause intermittent failures in a PLD that are only evident when the PLD is operating within a working system. Still further, it can be difficult to generate sufficiently varied test vectors to stress the PLD design to the point where most bugs are likely to be observed. For example, a PLD malfunction can result when the PLD is presented with stimuli that the designer did not expect, and therefore did not take into account during the design and simulation of the PLD. Such malfunctions are difficult to anticipate and must be debugged in the context of the complete system. Thus, simulation of an electronic design is useful, but usually cannot debug a PLD completely.

Approaches to debugging internal signals include: manually assigning signals to I/O pins and performing a full recompilation; using an embedded logic analyzer; and routing internal signals to I/O pins and performing an incremental recompilation.

A separate piece of debugging test equipment called a logic analyzer can be used to analyze signals present on the pins of a hardware device, after a full recompilation has been performed. U.S. Pat. Nos. 6,182,247, 6,286,114, 6,247,147 and U.S. Pat. No. 7,036,046 disclose techniques for using an embedded logic analyzer to view internal signals. In addition, viewing internal nodes in a device may be performed as disclosed in U.S. Pat. No. 6,754,862 and Ser. No. 10/629,508. Embedding a logic analyzer into a design is also a technique used in the product "ChipScope ILA" available from Xilinx Inc., of San Jose, Calif. The product "ChipScope Pro" also available from Xilinx uses logic cores built directly into a PLD to allow a user to access internal signals and nodes for debugging.

These techniques may fully recompile the electronic design before debugging can be performed. Once an electronic design for a hardware device such as a PLD has been compiled, though, it may not be desirable to fully recompile the design in order to facilitate a debugging technique. U.S. Pat. No. 7,076,751 entitled "Chip Debugging Using Incremental Recompilation" (which is hereby incorporated by reference) provides a technique to debug internal signals without having to perform a full recompile, thus saving time. These internal signals are routed to an output pin for viewing.

Internal signals that are routed to an output pin, however, will incur routing delays from the internal signal source to the output pin. This delay can make the investigation of the signal very difficult, especially for high-clock-speed designs. A delay in a particular signal could be important if an engineer needs to compare it to another signal for debugging.

In addition, any synchronization of groups of signals will be lost by the time these signals reach debugging test equipment connected to the output pins. In some situations, there are sixteen or thirty-two signals in a bus, and due to delays in their individual routings, these signals will arrive at the output pins at different times and will not be synchronized. When attempting to debug a fast-clock address bus, the address lines would incur different delays due to their individual routings to the output pins and the address word could be difficult to unscramble. The engineer is forced to examine the full trace for this address bus and may need to manually reconstitute the desired address word. Currently, engineers tweak different signals to synchronize them either using their test equipment or based upon their experience and guesswork.

FIG. 1 illustrates a prior art scenario in which two internal signals are viewed at device outputs. Screen shot 10 is a simple example of waveforms for two signals of interest, namely, "input1" and "input2." Viewed internally at reference numeral 20, both signals are synchronized at their source. These two internal signals have been routed to external pins of the device for debugging and these external signals are labeled "signalprobe1" and "signalprobe1." When viewed externally at reference number 22, however, it can be seen that these two signals 32 and 34 are no longer synchronized. This loss of synchronization is due to different routing delays within the device.

Given the lack of synchronization of such signals and the difficulties it presents, it would be desirable to have a technique to allow for such signals to be synchronized when viewed at their outputs by debugging test equipment. Such a technique would be especially desirable in the context of an incremental recompilation.

SUMMARY OF THE INVENTION

To achieve the foregoing, and in accordance with the purpose of the present invention, a signal routing technique is disclosed for debugging an electronic design that synchronizes signals of interest.

Embodiments of the present invention allow the user to specify a number of registers to be inserted in the route of a signal to be debugged, such that any set of signals (e.g., a bus) can be synchronized. In one embodiment, a signal is synchronized with other signals by inserting one or more registers between the internal signal source and the output pin where the signal is to be viewed. Insertion of these registers is used to delay the signal and to align all of the signals in a group to the same clock.

In one embodiment, the user specifies the number of registers to insert for each signal to be debugged and also specifies which clock signal to use for the registers. The present invention then automatically places and routes the additional registers and connections without disturbing the existing placement and routing of the user's design. Thus a synchronized set of signals to be debugged are presented at the debugging output pins. In an alternative embodiment, software will automatically calculate for the user the correct number of registers to insert for each signal to be debugged.

Where feasible, the first register is added to the I/O atom of the output pin where the signal is to be viewed. In other architectures where registers are not available in the I/O atom of an output pin, the register is placed as close possible to the I/O atom. In one particular embodiment, a single register is added for all signals of a bus to be synchronized, plus additional registers are added to those particular signals that need to be delayed further to provide synchronization. The present technique allows flexibility for the user to manage these registers while providing an effective solution to the synchronization of bus signals to be debugged. The added registers and connections can subsequently be removed to restore the original placement and routing once debugging has been successful.

The present invention provides numerous advantages in its embodiments. The user is given control over which signals should be debugged and how many registers should be inserted in a particular debugging connection path. The user also has the ability to select any of a number of clock signals to be used to clock a set of registers. Inserted registers are automatically placed and routed without disturbing the existing placement and routing.

The present invention provides the ability to incrementally route out signals from within a previously placed and routed design to pins on a hardware device for debugging purposes. This facility is useful when a design simulates correctly, but does not function as intended in hardware. Because a full recompile is not needed, the problem being investigated is not disturbed and no new problems are introduced. And because compilation is incremental, it takes a very small amount of time relative to the original compilation time.

Using an EDA tool to program and to debug a PLD, a user may choose to use the present invention when a bug is identified in a compiled design. Rather than having to change the design and perform a full recompile (which can take days), the user chooses an incremental recompile. Internal signals of interest to aid in debugging are selected, output pins are optionally reserved and a number of registers are specified per internal signal. The user then performs an incremental recompile of the compiled design. A full compile is not needed. Once the modified design has been programmed into a PLD, the user may then view the synchronized internal signals at their output pins to aid in debugging the PLD.

BRIEF DESCRIPTION OF THE DRAWINGS

The invention, together with further advantages thereof, may best be understood by reference to the following description taken in conjunction with the accompanying drawings in which:

FIG. 9 shows an example of a user interface having a timing report table.

DETAILED DESCRIPTION OF THE INVENTION

In order to develop an electronic design for programming a hardware device such as a programmable logic device (PLD), a programmable logic development system is used. As used herein, "electronic design" refers to designs for circuit boards and systems including multiple electronic devices and multi-chip modules, as well as integrated circuits. For convenience, the following discussion will generally refer to "integrated circuits," or to "PLDs," although the invention is not so limited.

Debugging Example

Figure 1:
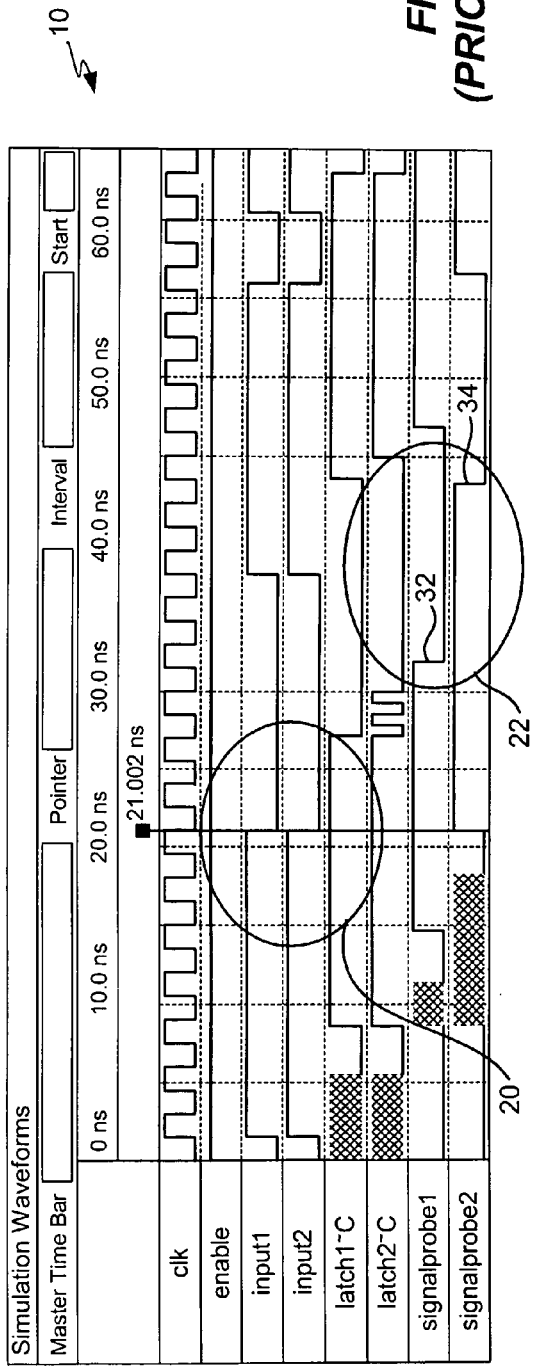
FIG. 1 illustrates a prior art scenario in which two internal signals are viewed at device outputs.
Figure 2:
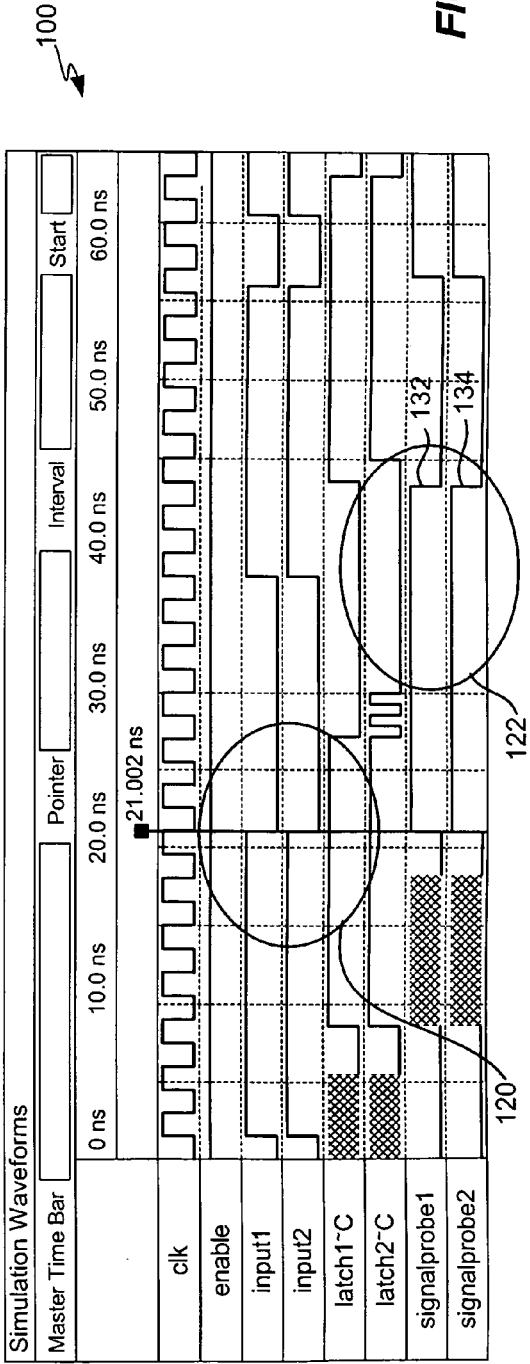
FIG. 2 illustrates two internal signals viewed at device outputs according to the present invention.

FIG. 2 illustrates timing waveforms for two signals to be debugged according to the present invention. Similar to FIG. 1, FIG. 2 shows two internal signals of a device, namely, "input1" and "input2" that are to be debugged. In this example, the present invention has been used to insert any number registers into the signal path of these signals between their source and an output pin. At the output pins, these internal signals are labeled "signalprobe1" and "signalprobe2." Internally, the two signals are synchronized at their source as shown at reference numeral 120. By virtue of the present invention, these two signals 132 and 134 are also synchronized at their outputs as shown at reference numeral 122. Thus, the internal synchronization of these two signals is preserved at output pins of the device in order to facilitate debugging.

Figure 3:
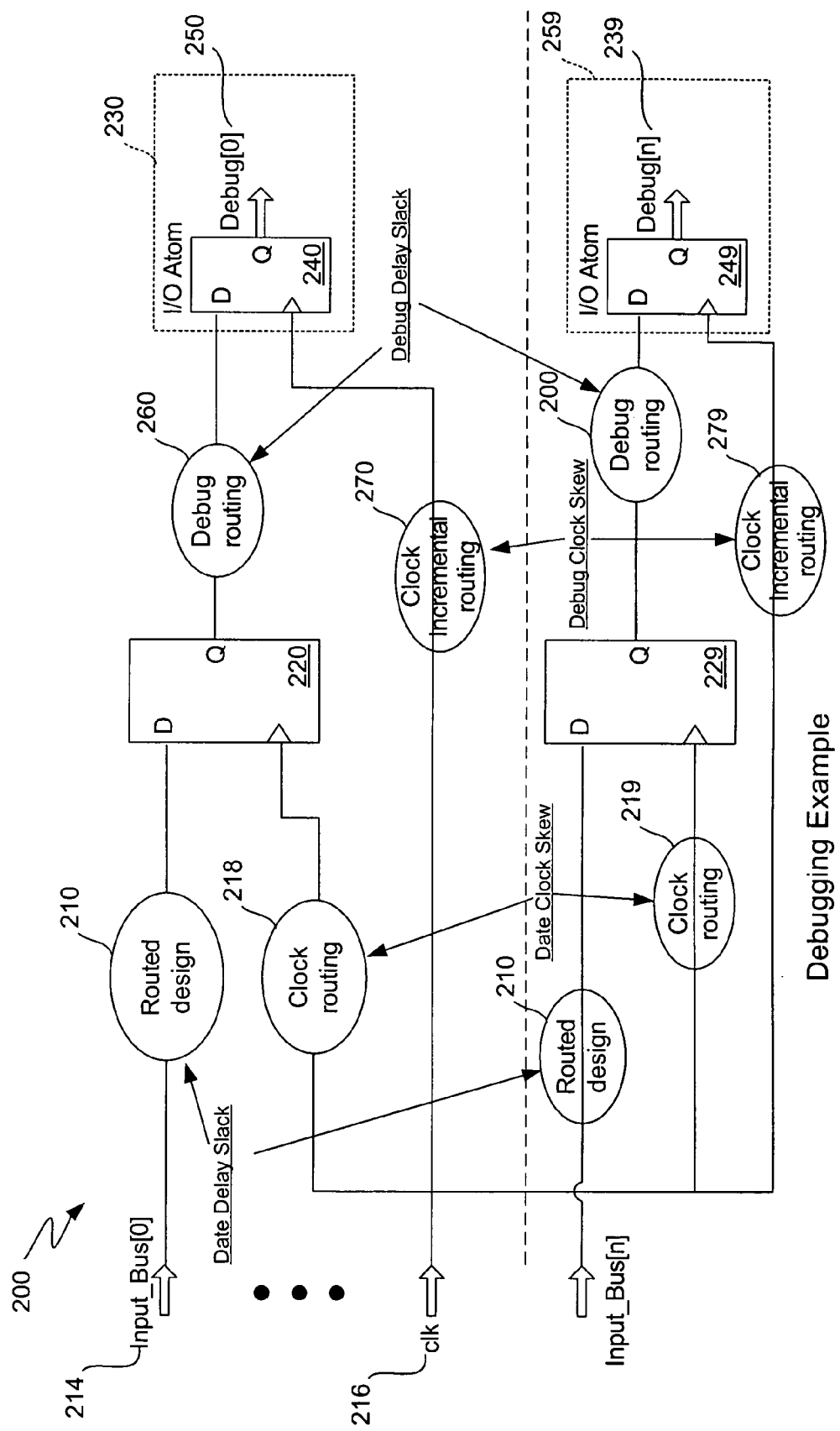
FIG. 3 illustrates a simple circuit within a portion of a PLD to be debugged according to one embodiment of the present invention.

FIG. 3 illustrates a simple circuit 200 within a portion of a PLD to be debugged according to one embodiment of the present invention. In this example, a user has programmed a PLD with the user's electronic design and has taken advantage of the present invention in order to debug a particular bus. A portion of the user's electronic design is shown represented by routed design 210, input bus [0 ... n] 214, a clock signal 216 and D flip flops 220–229. For ease of presentation, only the first and last signals of input bus 214 are shown, although any number of signals are possible. I/O atoms 230–239 are associated with output pins of the PLD, and it is to these pins that debugging test equipment (such as an oscilloscope or a logic analyzer) is attached to perform debugging. The user is interested at looking at the outputs of flip flops 220–229 in order to debug input bus 214. In this example, the user has already executed an aspect of the present invention and the following logic and connections have been added to facilitate debugging.

FIG. 3 also shows various slacks and skews which will now be further explained. Data Delay Slack is the slack between signals of the bus when they feed their particular register. In most circumstances the design is correct, and the slack should be less than a clock period and allow the bus to stay synchronized. If this is not the case (due to user error or the inability to route a signal), the compiler typically returns an error message. Data Clock Skew is the slack between clock signals when they clock the registers of the bus. Any such problem with this slack typically is taken care of by the user. Debug Clock Skew is potentially the same problem for the added registers. Debug Delay Slack is the slack between debugging signals when they arrive at the output register of their particular I/O atom. This slack could cause a loss of synchronization in the bus signals at the output pins of the PLD. By virtue of the present invention, though, the user has control over how many registers to insert along a particular connection path for a signal and this slack problem is overcome.

Debug routing 260–269 has been added in order to route each bus signal from its flip flop output to its corresponding I/O atom where it can be viewed at an output pin of the PLD. Also added within each I/O atom is a D flip flop 240–249 for each bus signal. Outputs Debug [0 ... n] 250–259 route the output of flip flops 240–249 to the corresponding output pin of the PLD.

Additional signal routing 270–279 has been added in order to route clock signal 216 to each of the added flip flops 240–249. As will be explained in more detail below, the user may choose any suitable clock to trigger each set of flip flops added for a particular signal. In this example, the clock used to trigger the internal bus signals is also used to trigger the added flip flops. In most situations, a user will choose to use the clock that triggers the bus internally to also trigger the additional flip flops that are used to synchronize the bus signals at the output pins. For each bus signal, though, the user is allowed to choose a different clock signal if desired.

In this example, a single additional flip flop has been added for each bus signal in order to assist with synchronization of the bus signals for debugging. Where a particular PLD architecture allows a flip flop to be inserted into the I/O atom of an output pin, then the insertion is done in the I/O atom. For those architectures that do not allow a flip flop to be inserted into the I/O atom, the flip flop is preferably inserted as close as possible to the I/O atom.

For any particular bus signal, debug routing 260–269 may include any number of additional flip flops that further serve to delay a particular signal in order to synchronize it with the remaining bus signals. In other words, while one bus signal may only have one additional flip flop, other bus signals may be further delayed by a total of two, three or more flip flops. It is not required that an additional flip flop be added to any particular signal. In other words, a signal may be routed directly to an output pin without the addition of a flip flop if this serves best to help synchronize the signal. In practical application, though, insertion of at least a single flip flop into the I/O atom (or as near as possible) of the signals to be synchronized insures that there is no problematic delay from one I/O atom to another.

This simple example shows D flip flops being added in a signal routing in order to further delay a particular signal in order to help synchronize a group of signals (such as a bus, for example). Other types of flip flops such as the R-S flip flop, the J-K flip flop, etc., may also be used to help delay a signal in order to help with synchronization. A register is a collection of a set of flip flops that are logically connected together to perform a specific function such as a latch, a buffer, a right or left shift, parallel in/parallel out, serial in/parallel out, etc. As used herein, the term "register" is used to refer to any of the aforementioned flip flops, as well as traditional types of more complex registers. The invention may be implemented using any of these traditional types of registers or flip flops, although in a preferred embodiment, the D flip flop is used due to its simple implementation.

In this example, the user is interested in debugging input bus 214, although the invention is not limited to the debugging of buses, but may be used to debug any type or number of internal signals of interest to the user that can be accessed. There are small number of types of signals that are not able to be accessed. For example, signals present in the user's original design might have been optimized away in synthesis, so are no longer present and available. Also, some atom outputs are restricted to being single fan-out—so therefore cannot drive a second, debug output. Some signals are incapable of being physically or legally routed to separate output pins—such as negative output pins for double-ended I/O standards. These vary according to the target device family but examples include carry chains, cascade chains, and PLL clocks. Other than these limited types, the present invention is applicable to any suitable signal.

Further, this example shows the output of a register being routed to an output pin. In most circumstances, a user desires to look at the output of a register for debugging purposes. Nevertheless, the invention is not limited to analysis of a signal that is necessarily the output of a register; other types of signals may also be routed to an output pin and may have registers inserted in their routing path in order to facilitate synchronization and debugging.

Figure 4:
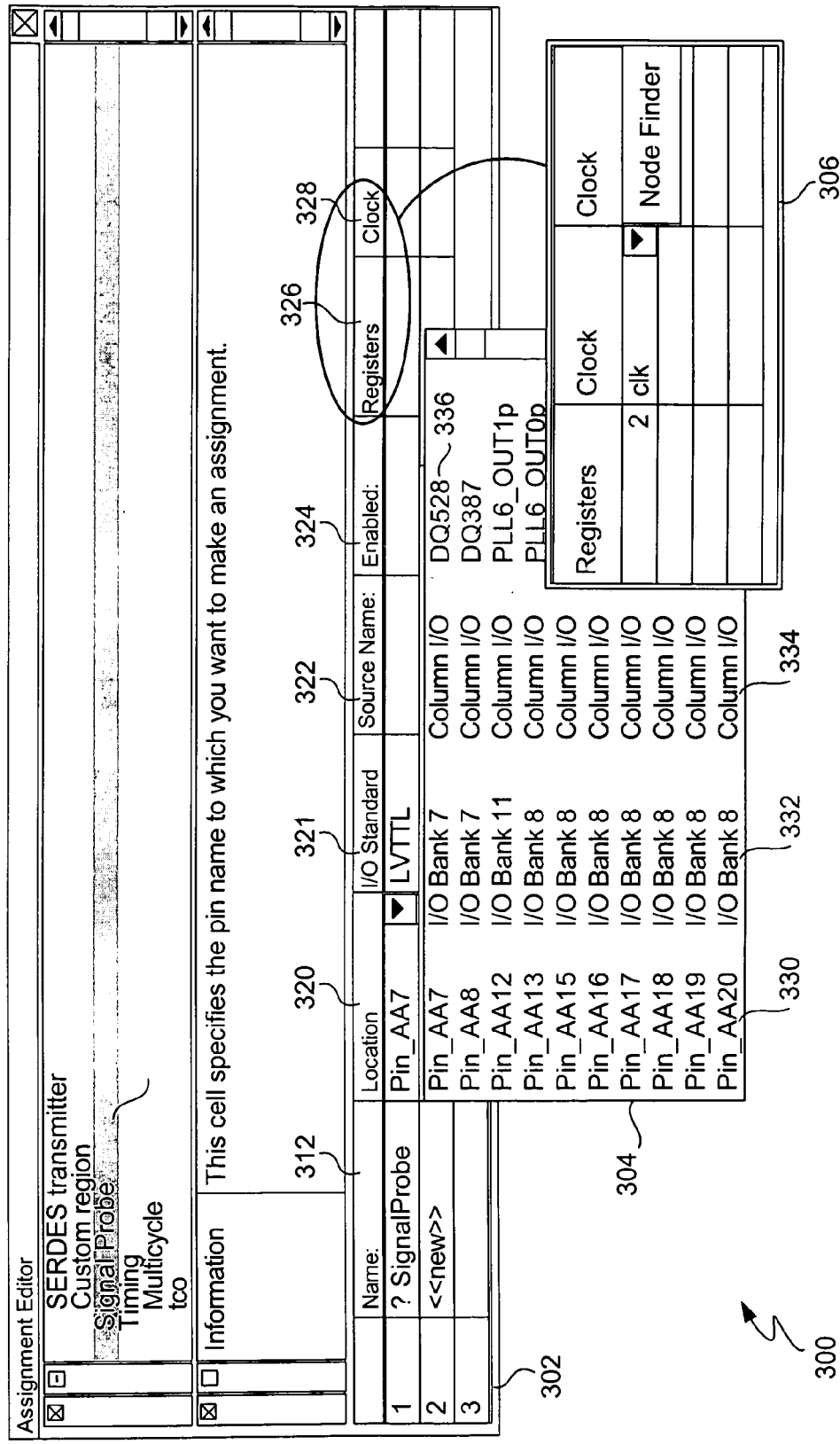
FIG. 4 illustrates an example user interface suitable for an embodiment of the present invention.

FIG. 4 illustrates an example user interface suitable for an embodiment of the present invention. In the course of programming and debugging a PLD, an engineer typically uses a software EDA tool operating on a computer. User interface 300 is an example of a possible user interface presented to the user while using an EDA tool in the course of debugging a PLD. In this example, an engineer has programmed a PLD and is attempting to debug it by using the user interface to select signals of interest and to add in registers in order to synchronize the desired signals.

Shown is a main window 302, a pull-down menu 304 and an enlargement of a portion of window 302, namely, 306.

Name "SignalProbe" 310 is an example of a name of a debugging feature in an EDA tool that allows for synchronization. Shown in window 302 are numerous columns. Column "Name" 312 indicates a name chosen by the user for a particular debugging signal. Column "Location" 320 shows a particular output pin physical location of the device chosen by the user to which an internal signal will be routed.

Column "I/O standard" 321 indicates the type of output pin chosen, and will preferably default to the chip default type. Column "Source Name" 322 is the name of an internal signal that the user wishes to route to the output pin so that it may be viewed by external debugging test equipment. The internal source name is dependent upon which particular software EDA tool is being used and may take many different representations as is known in the art. Column "Enabled" 324 indicates "on" or "off" and can be used to temporarily disable routing of the source to an output pin if the user wishes to perform an incremental recompilation (or a full compilation) without the routing at that particular time. Disabling the routing using this selection is useful for disabling the connection without deleting the assignment.

As shown, the user has clicked Location 320 and pull-down window 304 has appeared. In this window appears a column of output pin names 330 showing the user output pins that are available to which an internal source signal may be routed. In this example, the user has chosen Pin_AA7 as an output pin. Column 332 indicates in which I/O bank the output pin is grouped, and column 334 indicates which type of I/O pin it is. Column 336 indicates a secondary function for which the output pin may also be used.

For each particular connection (i.e., a routing from an internal source to an output pin), the user selects button 326 in order to choose how many additional registers they wish to insert in the connection path in order to further delay the internal signal in order to achieve synchronization. If no additional registers are desired, no selection is needed. Window 306 is an enlargement of columns 326 and 328 showing an example of a choice made by the user.

A user may choose zero additional registers to be inserted or may choose any other quantity to be inserted. Typically, one register is inserted for each bus signal inside the I/O atom of the output pin to which the signal is to be routed, although any number of additional registers may also be added. In most situations, it is contemplated that a total insertion of one or two, and in some cases three, registers will be sufficient to help achieve synchronization. In this example, the user has chosen two registers to be added. In this example, the number of additional registers to add is chosen based upon the experience of the engineer. Alternatively, the number of registers to add is automatically chosen as described in FIG. 8.

Also chosen for the clock 328 is the clock signal "clk" which will be the clock signal that triggers the additional registers added for this particular routing. As shown in window 306, a further pull down menu named "Node Finder" allows the user to browse all available clocks within his or her electronic design, allowing the user to choose any of a variety of clocks to clock the additional registers. As a user design will typically have more than one clock, examples of clocks that may be chosen by the user include any desired clock signal, although typically the user will choose a global clock signal, or at least the same clock signal that is used in the clock domain of the source data signal.

Figure 5:
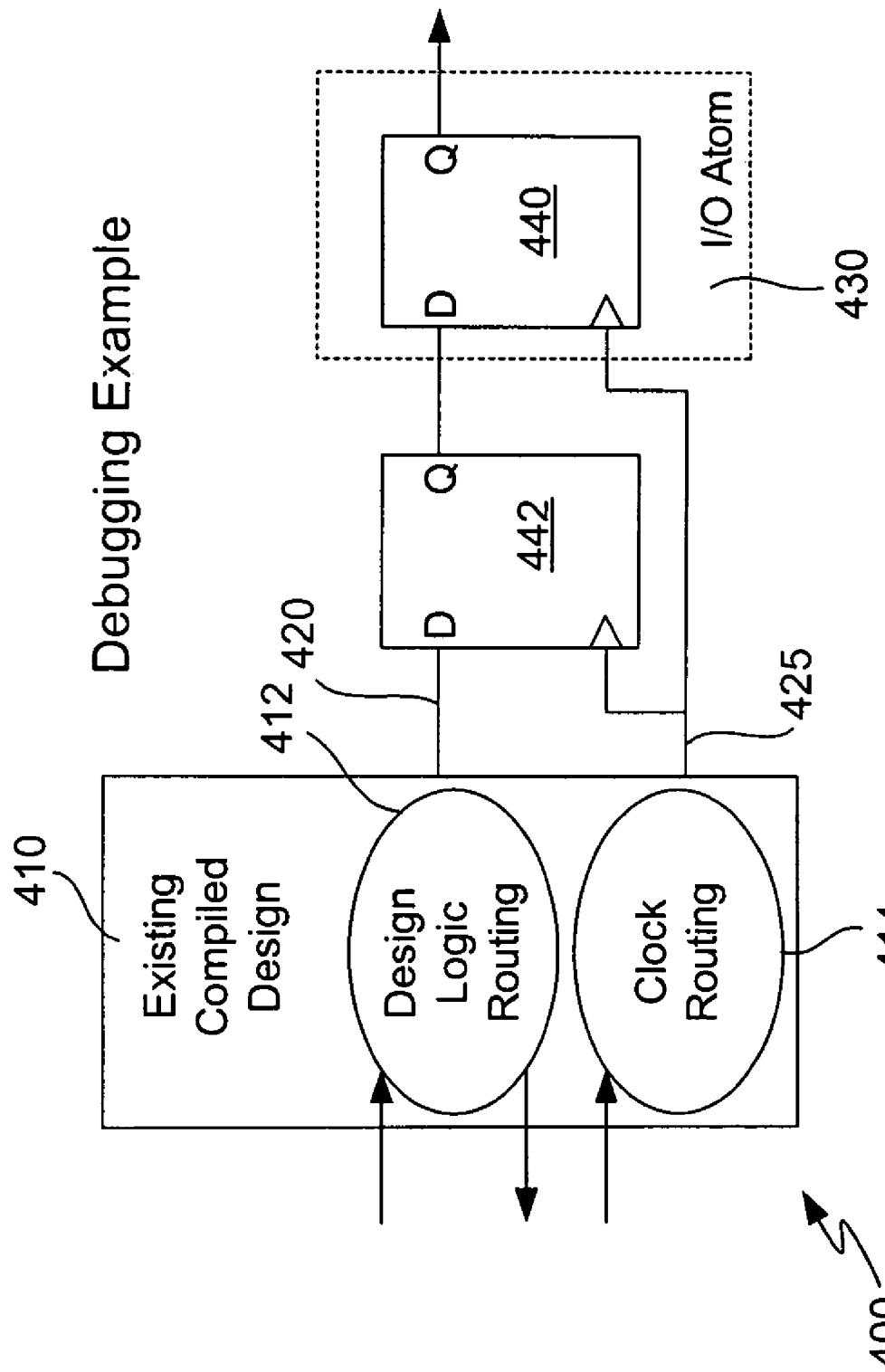
FIG. 5 illustrates a debugging example based upon the choices in FIG. 4.

FIG. 5 illustrates a debugging example based upon the choices in FIG. 4. Example 400 is a simplistic representation of the user's electronic design and the additional registers added to help achieve synchronization. The user's existing compiled electronic design 410 includes the specific design logic 412 and the clock routing 414. Signal 420 is the internal signal of interest that the user wishes to debug by viewing at output pin Pin_AA7. In this example, the user has determined that two additional registers are to be added to the connection path for this signal in order to further delay the signal.

I/O atom 430 is the logic associated with output pin Pin_AA7. As shown, the present invention has operated to insert two additional registers into the PLD, namely register 440 (inside the I/O atom) and register 442. Clock signal "clk" 425 is the chosen clock signal and is shown as being the trigger for registers 440 and 442. By use of the additional two registers, signal 420 will be further delayed thus serving the purposes of the user for either synchronization with other signals or simply to delay the signal for ease of debugging.

General Flow

Figure 6:
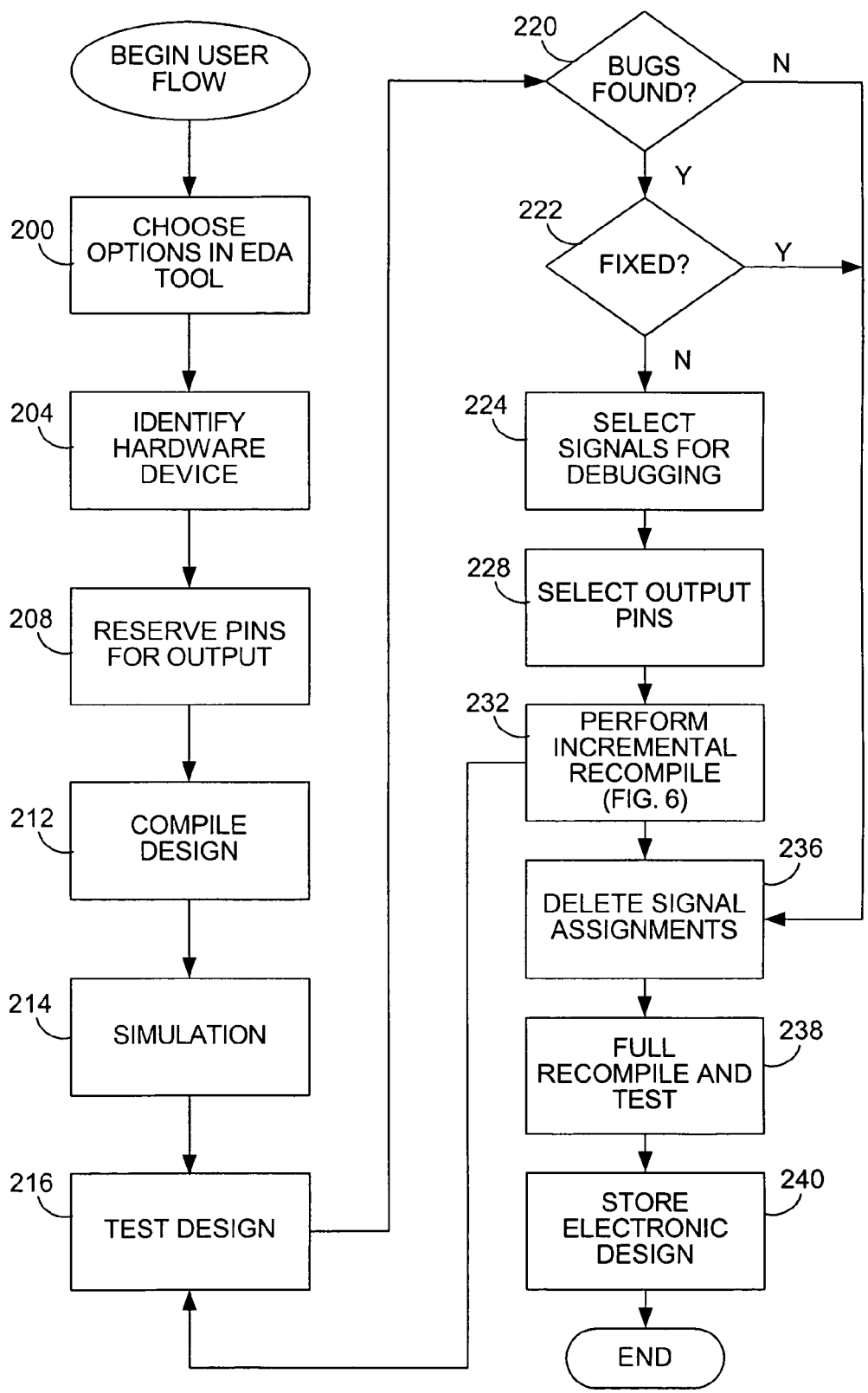
FIG. 6 is a flow diagram describing one embodiment of the invention in which a user debugs a PLD.
Figure 7:
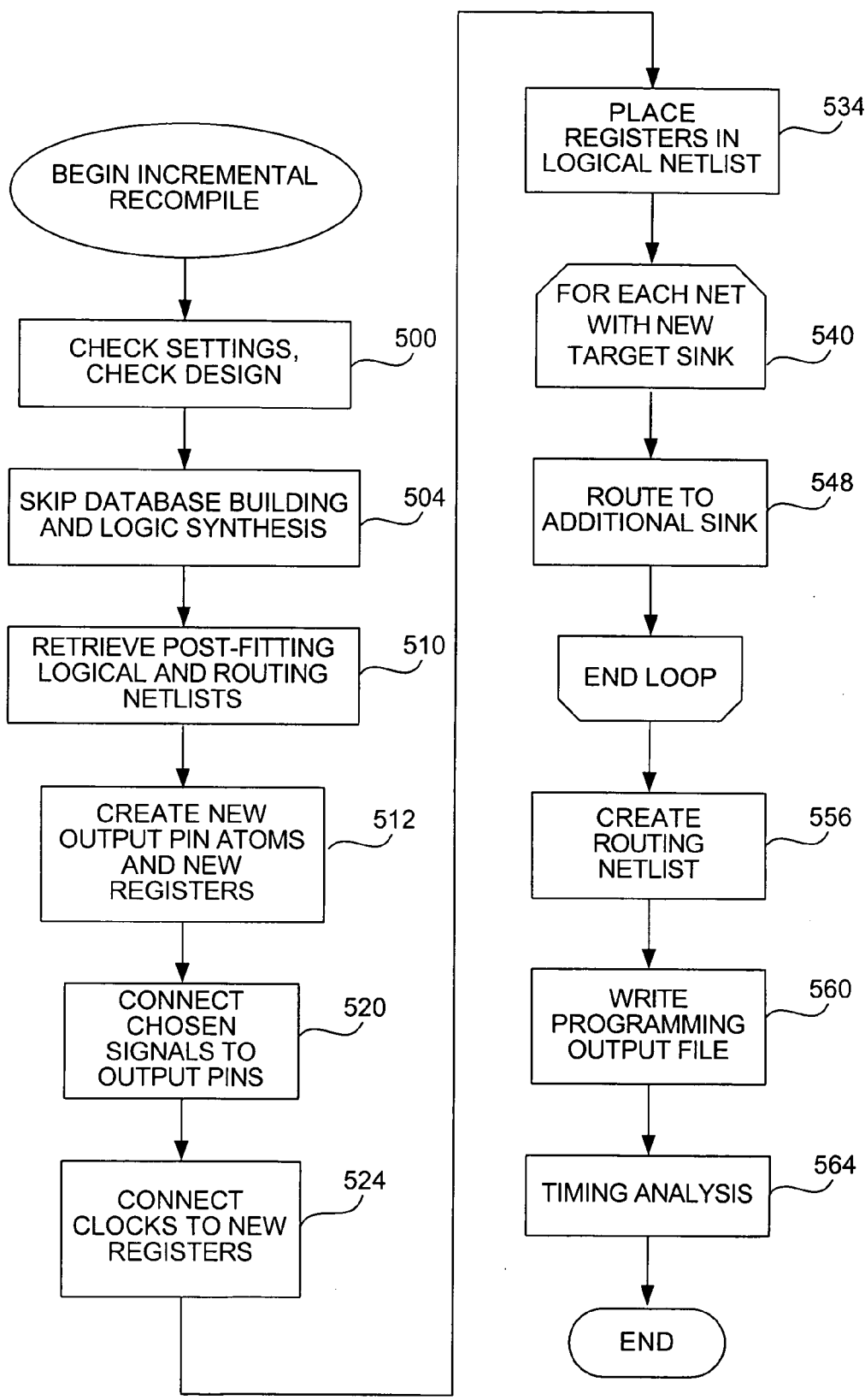
FIG. 7 is a flow diagram describing the incremental recompile step of FIG. 6.

FIGS. 6 and 7 describe a technique for compiling and debugging an electronic design according to one embodiment of the present invention.

Compilation stages may vary depending upon whether one is compiling a design for a PLD, a custom integrated circuit design, or for a printed circuit board. For ease of explanation, the below description uses the example of compilation performed for a PLD. The stages used in such a compilation are as follows.

In an initialization stage the compiler decides, based on design or setting changes made by the user, which parts of the compilation flow need to be executed and spawns the appropriate processes. During the database building stage, a database is constructed, if one does not exist already, or restored to memory if a database does exist from a previous compile. Next, in the logic synthesis stage, a hardware description language is analyzed and a logical netlist (or "technology-mapped netlist") is output. Next, in the fitting stage, the logical netlist is input to the Fitter which produces a routing netlist indicating the physical routing in an actual hardware device. A post-fitting logical netlist is also output which includes updates made to the logical netlist. (The fitting stage has three parts: clustering; placement; and routing.) Finally, in the assembly stage, an assembler takes the routing elements and routing netlist from the Fitter and outputs a bit stream which is saved into a file typically known as the programming output file (POF). A compiler may also perform timing analysis in which the delay paths in a design are calculated to provide the signal delays for the design. Timing analysis helps the user ensure that the timing constraints for the design are still satisfied.

FIG. 6 is a flow diagram describing one embodiment of the invention in which a user debugs a PLD. For purposes of this discussion, we assume that a user has created an electronic design using any of a variety of electronic design automation (EDA) tools. EDA tools are available from such companies as Altera Corporation, Xilinx, Inc., Synopsis, and Mentor Graphics.

In step 200, the user may choose to enable options in the EDA tool to allow a recompile to be performed much faster. For example, the user chooses a "save logical netlist" option that allows the logical netlist produced during the compile to be saved onto the user computer. Saving of the logical netlist allows a future recompile to save considerable time, and although not required, is the preferred embodiment of the invention. Normally, saving of the logical netlist is the default. Should a user not wish to save the logical netlist, or if there is not enough space on the user computer, the user may choose not to save the netlist. Other options that may be set at this time include the selection of the level of optimization of the compiler.

The level of optimization of the compiler is controlled through various settings including timing-driven compilation. Timing-driven compilation, which can be turned on or off, places and routes a design to optimize the timing of the circuit, and the optimization effort can be directed towards certain types of timing paths in the circuit, e.g., hold-time paths or tpd paths. Also, the level of optimization effort can be set using three different settings: highest effort medium effort and auto-effort (which stops when the user requirement has been achieved).

In step 204, the user inputs to the EDA tool the specific hardware device that will be programmed so that pin assignments can be made. (Alternatively, the user may make assignments directly into a compiler's settings file). In an alternative embodiment, the user may choose not to specify a particular hardware device but may instead choose a general device family and let the EDA tool automatically select an appropriate device from within that family (for example, by using the smallest suitable device). For example, a user may specify any of the APEX, Stratix or Excalibur device families available from Altera Corporation and have the EDA tool select from a device within that family.

In step 208, the user may choose to reserve particular pins on the device to output the internal signals to be analyzed. For example, should the user wish to analyze three internal signals, three pins of the PLD may be reserved at this time. Reserving these pins means that in the course of the fitting stage of a compile, these pins would not be used for placing and routing and will be saved for the debugging output. A reserved pin is reserved even though it might not appear in the design file. This reserve step is optional, should a user not reserve pins in this step, the compiler will choose appropriate pins during the course of a compile to which the internal signals will be output. Alternatively, a user may choose to make pin assignments before compilation takes place to specify which pins should perform which function for the device. If this technique is used, then the compiler would, by default, need to use those unspecified pins to route out internal signals for debugging.

In step 212, the user commands the EDA tool to perform a full compile of the electronic design. The compilation produces both a post-fitting logical netlist and a routing netlist that are normally saved. In step 214, the user may perform simulation using the EDA tool or another specialized software tool. At this stage of the process, the electronic design may simulate correctly, however, it is possible that a device that simulates correctly may not function correctly in the actual hardware device. Alternatively, a user may perform a simulation part way through the compile process as is known in the art.

In step 216, the user programs the hardware device with the compiled electronic design and tests the design in the hardware device. Testing may occur in a variety of ways including using an external logic analyzer connected to pins of the device, or by using an internal logic analyzer such as is described in the above-referenced U.S. patents and patent applications. If no bugs are found, then control moves to step 236.

Assuming, though, that a bug is found in the design, in step 224 the user selects internal signals to be debugged using the EDA tool. The user selects an internal signal (or "node") to be debugged. Although almost any internal signal can be selected for debugging, there may be limitations on certain signals. For example, signals present in the original electronic design but not appearing in the final post-compilation routing netlist may not be available for debugging. Also, a bus or group of signals may not be able to be routed to a single output pin and signals from certain components such as carry chains, cascade chains, and PLL clocks may not be physically able to be routed to an output pin.

In one embodiment, the user is responsible for selecting an appropriate signal for debugging (although the EDA tool may provide a warning message if an inappropriate signal is chosen). Alternatively, the EDA tool may filter the available nodes such that only appropriate nodes for output are presented to the user, or the user may use specific filters to be used when selecting a node. One embodiment for node selection is explained in U.S. patent application Ser. No. 10/351,017 referenced above.

If the user wishes to perform several minor design debugging iterations a flag may be set. For example, when signals are selected in step 224 an "automatic route" compiler setting may be set to "active" to always route out the internal signals of interest even during a full compilation. This setting may also be set in step 200 or at another appropriate time. When active, this setting will connect the chosen signals even during a full compilation. This technique saves time if the user is performing many compilations as part of debugging a design. During such a compilation when this setting is active, the compiler checks to ensure that the source nodes still exist and that they have not been renamed. If the user has made a design change such that the specific nodes no longer exist and do not appear as post-compilation nodes, the compiler generates a warning.

In step 228, the user selects output pins on which to view the selected internal signals. One embodiment for output pin selection is explained in U.S. patent application Ser. No. 10/351,017 referenced above. For example, a user may use a user interface to select previously reserved pins for output or select unused pins for outputs. These pins may have been previously selected and reserved in step 208. If not, the user selects one output pin per signal. Certain output pins may be unavailable for use; these output pins may be flagged in a user interface, may generate warning messages when chosen, or the EDA tool may filter out such output pins such that they are not presented to the user for a possible selection. For example, certain dedicated pins may be unavailable for selection and standard I/O restrictions may prohibit two types of pins from being placed next to one another that may limit the choice of an output pin. Examples of dedicated pins that might be unavailable for use include dedicated clocks, fast pins, dedicated pins, PLL pins and clock enable pins. In a preferred embodiment, the EDA tool filters out such unavailable output pins and only presents those available output pins to the user for selection.

In an alternative embodiment, the user may choose the input to an embedded logic analyzer as the "output" pin to which the internal signal is routed. The embedded logic analyzer may be any of those previously mentioned, or a similar device. Or, the selected signals may be routed to other internal locations.

The signal selected for routing may already by routed to a given output pin yet the user wishes the signal be routed to a different output pin for ease of debugging. In this situation, the internal signal is also routed to the newly chosen output pin. The path to the previous output pin may be left in place. Should it be desired to delete the older routing, then an incremental compilation can be performed to remove that routing.

In step 230, the user chooses the number of registers to insert and selects a clock signal for each internal signal that has been selected in step 224. For those signals that do not need to be delayed further, the default is that no additional registers will be inserted. The user may choose the number of registers for each internal signal and may select a clock signal as shown in the user interface example of FIG. 4. In other embodiments, other similar user interfaces may be used or the user may modify an assignment directly, adding in the number of registers and clock signals. In this fashion, registers are added incrementally as a user performs debugging and finds bugs in the design. In an alternative embodiment, a user may choose additional registers and select a clock for an internal signal before a full compile is performed in step 212. Signals may also be selected for debugging at this time along with output pins in which case a full assignment for particular signals to be debugged is executed before the full compile. In this fashion, a user is building into his compiled design debugging paths for internal signals that he or she knows that will need to be viewed using debugging test equipment. This technique, while not as common, is useful if the user knows ahead of time that certain signals will need to be analyzed.

An assignment in this embodiment includes an internal signal source name, an output pin location and name for that pin, the number of registers to be inserted along that path and a clock signal for the registers. When an assignment is deleted in step 236, this deletion will delete not only the connection from the source to the output, but also the additional registers and clock connections that had been added as a result of the choices made in step 230.

A pair of an internal signal and an output pin are also referred to as a "source/sink" pair. For each source/sink pair specified in the above steps (either via a GUI dialog box, script or other input), the EDA tool adds the following assignment to the chip section of a compiler settings file (assuming a single added register):

set_instance_assignment-name RESERVE_PIN "AS SIGNALPROBE OUTPUT"—to signalprobe_pin_name set_instance_assignment-name SIGNALPROBE_SOURCE source_signal_name—to signalprobe_pin_name set_instance_assignment-name SIGNALPROBE_ENABLE ON\OFF—to signalprobe_pin_name And if registers and a clock signal are specified to be added, the following are added:

set_instance_assignment-name SIGNALPROBE_CLOCK clock_name—to signalprobe_pin_na set_instance_assignment-name SIGNALPROBE_NUM_REGISTERS number_of_registers—to signalprobe_pin_name And if the I/O standard is not the chip default, the following is added:

set_instance_assignment-name IO_STANDARD io_standard_name—to signalprobe_pin_name In the case of reserving a pin, preferably only the LOCATION, RESERVE_PIN and SIGNAL_PROBE_ENABLE assignments are written to the compiler settings file. The interface between the GUI and the back-end process is via these above assignments for each source/sink pair and general compiler settings. For example, set_global_assignment-name SIGNALPROBE_DURING_NORMAL_COMPLILATION ON\OFF is the setting to automatically route debugging signals during compilation. And set_global_assignment-name SIGNALPROBE_ALLOW_OVERUSE ON\OFF is another global setting that allows modification of the previous routing results during a debugging, routing.

Of course, these above settings are specific examples in the context of one particular EDA tool available from Altera Corporation, other types and formats of settings may also be used. Once the appropriate assignments are created, the tool is ready to perform an incremental recompile.

In step 232 the user commands the EDA tool to perform an incremental recompile as is discussed below with reference to FIG. 7. Once an incremental recompile is performed, the user again programs the device and tests it as discussed in step 216 and on. FIG. 9 illustrates a timing report table that is available for review by a user after a design has been compiled. If all local routing resources are used such that a signal cannot be routed to an output pin, the compiler may provide a warning and continue with further compilation. Preferably, to not adversely effect the time to compile, the existing routing is left unchanged. Alternatively, the user may choose to proceed directly to step 236, without further testing. Or, once debugged and recompiled in step 232, it is possible for the user to release the electronic design without removing the debugging signal assignments and without testing one last time. Thus steps 236 and 238 may be skipped, although it is preferable to perform them.

Returning to discussion of when no bugs are found in step 220, or if the design has been fixed in step 222, control also moves to step 236. In step 236 the added signal assignments for debugging are deleted from the design, along with the added registers and their clock signal connections. In step 236 the dedicated output cells and the additional routing can be removed by either disabling or deleting all assignments. Disabling the assignments will still leave the output pins reserved in the compiled design, whereas deleting the assignments will completely remove them.

In step 238 the user executes an incremental recompile and tests the design in hardware one last time before releasing the debugged electronic design. The incremental recompile will remove the deleted assignments from the design. As the user might have changed the original design or its placing and routing in order to fix a bug, a final incremental recompile and test will verify that these changes had not affected the design. Alternatively, the user may choose a final full compile before testing the design. A final compilation also ensures that the deletion of the debugging assignments did not introduce new problems. In step 240 the final, compiled electronic design is stored for later use or is programmed into a hardware device.

Incremental Recompile

FIG. 7 is a flow diagram describing the incremental recompile step of FIG. 6. An incremental recompilation is done in order to add in the new registers previously selected. Such an incremental recompilation may also be performed using the incremental recompilation technique described in U.S. patent application Ser. No. 10/351,017 referenced above. The below technique makes use of the logical netlist and the routing netlist that had been created and saved during the earlier full compilation. Changes to the post-fitting logical netlist are made to add in the new registers and clock connections, which logic is then combined with the original routing netlist to produce a new routing netlist. The result is a fast recompilation producing the desired debugging signal connections.

The Fitter during the incremental recompile automatically places and routes the inserted registers, with the understanding that the existing placement and routing should not be disturbed. Placement seeks to minimize effects of Debug Delay Slack and potential Debug Clock Skew for any non-global clocks. By default the existing placed and routed design is not disturbed, so that the user can debug the design without affecting it. This default choice may result in the inability to route certain signals (due to local resource usage on the PLD by the current placement and routing).

An option to allow modification of existing placement and routing in order to route internal signals is provided in the user interface. This option is called the "SIGNALPROBE_ALLOW_OVERUSE option" in one embodiment. By default, one embodiment of the invention tries to make the connections without touching the existing routing. But use of this default implies that it may not always be possible to route the debugging connections if routing resources are local fully utilized by the initial place and route. Instead the user receives a warning message to the effect that the debugging connection could not be routed and that the connection will not be made.

The above option does allow the latest fitting results to be modified during a compilation, and is a way around the problem described above. Enablement of this Option allows the invention to rip-up and re-route some of the original routing in order to make the new connections. Generally, the user will use the default, unless he or she needs to route a particular signal out to a pin that will otherwise fail to route.

In step 500, settings may be checked such as the level of optimization to be done during the compilation. Checking of the design is also performed to ensure that the user has not changed code in the files, the device family, or the device. If the design has been changed in this way, a full recompile would be performed. The database building and logic synthesis stages are skipped in step 504 and the incremental recompile may move directly to the fitting stage once the new registers and clock signals are added.

In step 510 the post-fitting logical netlist and the routing netlist which had been created during the earlier full compilation are retrieved. In step 512 new atoms (device components) are created for each new output pin chosen by the user to output a debugging signal. The output pins are also placed. Additionally in step 512, all new registers that the user has chosen to be added for debugging (for example, as shown in FIG. 4) are created in the post-fitting logical netlist. In this embodiment the new registers are not placed in this step, with the exception that a single register is packed into the I/O atom of a chosen output pin if such packing is feasible.

In step 520 the chosen internal signals to be debugged are connected to the new atoms representing the output pins via the selected number of registers. In step 524 each newly added register is connected to the appropriate clock signal chosen by the user (for example, as shown in FIG. 4. These connections of step 520 and 524 are performed in the logical netlist. The resulting netlist is checked to make sure there are no errors. The result is a "legal netlist" which is the original logical netlist plus the new atoms, registers and connections added.

Next, the Fitter is used to take the modified logical netlist and generate a routing netlist as described in steps 534–548. In step 534 the Fitter is used to place the new registers. This step involves determining the optimum physical location for each new register. The loop beginning at 540 takes each new connection in the logical netlist and creates a corresponding routing. In this loop the Fitter will loop through each net of the netlist to determine if the net has a new connection, i.e., if there is a source node that must be routed to an output pin. In general, during loop 540 those nets which are sourced from nodes selected by the user have their trace head structures updated. For each of these nets, the goal is not to change what is there but to add to it.

In step 548 for each net the internal signal for debugging is routed to the additional flagged output sink. In general, the Fitter finds the optimal physical connection route on the device to route the internal signal to the output pin. A wide variety of routing algorithms may be used. By way of example, a standard routing technique such as a modification of Dijkstra's algorithm may be used (also referred to as an "A* search").

Those nets that do not include either an internal signal to be routed or a flagged output pin would not need to be processed in this loop. In other words, all nets other than the ones with flagged outputs are skipped as they are already routed. A re-route of those remaining nets is forced. The net corresponding to a source signal is reconstructed as per the last successful compilation from the previous routing netlist saved in the database. This reconstruction would not include the route to the flagged output pin, but the pin is marked as a target for the net. Some routing constraints (e.g., bounding box) may be relaxed for this routing.

In one embodiment, a function is called for those nets that are sourced by nodes selected by the user to be routed out. Preferably, the pins are ordered such that the output pins are last. Instead of reviewing the whole net, data structures are built as they would have been after routing the net in the original compilation and then the normal algorithm is used to route out to the final sinks. It is preferable not to disturb other nets; to that end it is desirable to not include routing resources that are already full to capacity. It is possible that a user may add more than one connection from a particular net.

The new routing may be added as follows: for each net to be processed, the first sinks on the net are the sinks that were there for the original compilation. The last sinks are the new sinks for the additional debugging routing. Before applying the routing algorithm, the route tree structure is set up as it was for the original compilation. The standard routing algorithm then routes out the chosen internal signals. One modification of the standard routing algorithm is that a "no over use" parameter is set to stop the inclusions of any routing resources that are already used to capacity.

In one embodiment, the compilation flow will be the same up through the end of the fitting stage and then the flow will loop back through the Fitter to add the extra routing and selected output pins before continuing through the remaining compilation steps. The result after the end of the loop is a Fitter internal representation of the routing netlist. Translation is performed in step 556 to create the routing netlist. This new routing netlist includes not only the original routing netlist created during the full compile, but also the new connections that routes the internal signals of interest to particular output pins via the added registers. This routing netlist includes the physical routing elements as well.

After fitting, in step 560 an assembler uses the routing netlist and routing elements to produce a bit stream for programming the hardware device, such as a PLD. This bit stream is typically written into a programming output file (POF) which is saved for later programming of the hardware device. In step 564, timing analysis may be performed in which the delay paths through the electronic design are recalculated to provide the signal delays for the user. This step insures that the timing constraints for the device are still satisfied and that the device will still perform at the speed desired after routing as the addition of any new routes to output pins may affect delays on the net. In addition, this step provides the timing delay from the internal signal of interest to its appearance at the output pin to assist with debugging.

Incremental Recompile with Automatic Register Selection

Figure 8:
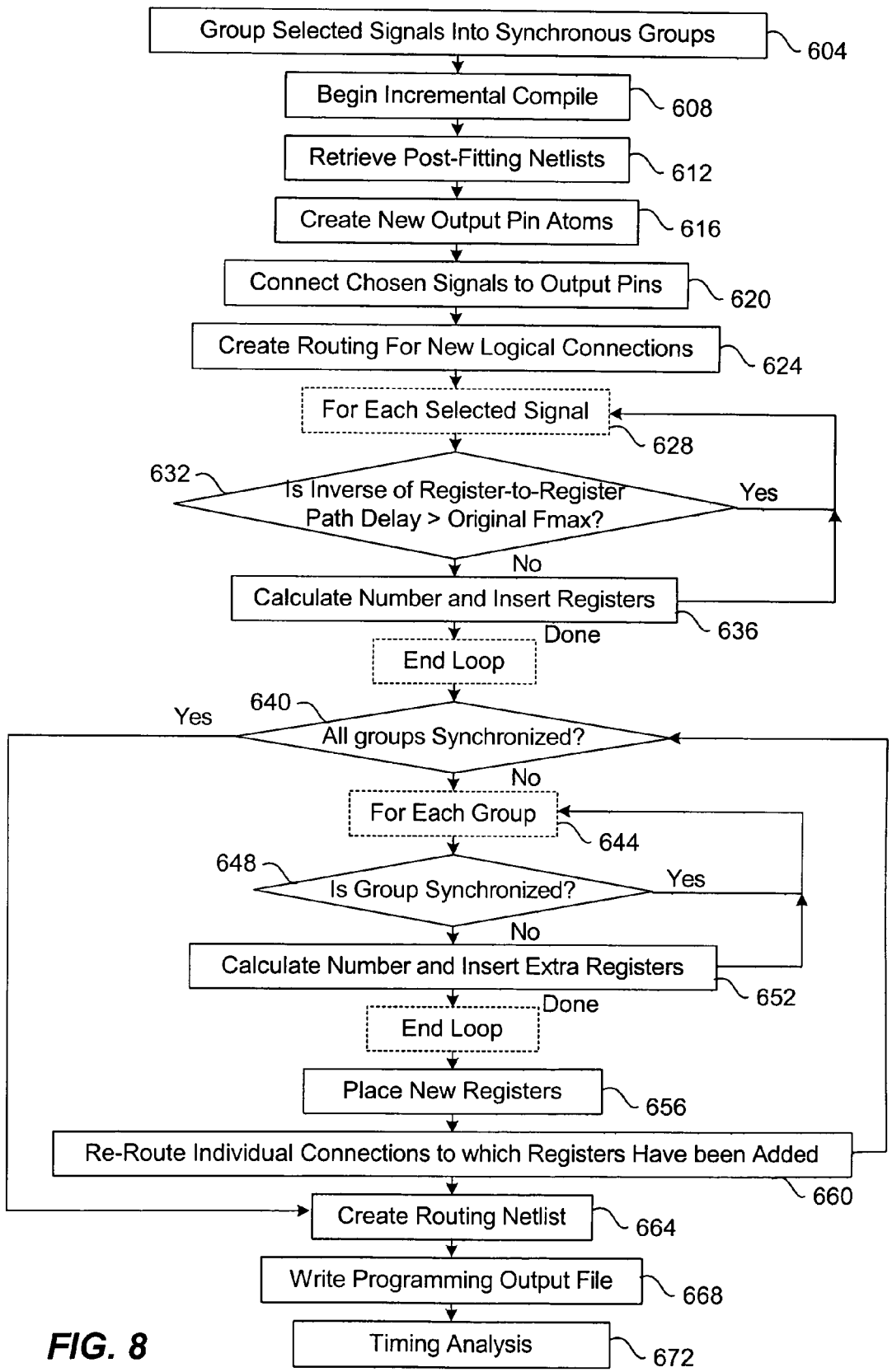
FIG. 8 is a flow diagram describing an incremental recompile in which registers are chosen automatically.

FIG. 8 is a flow chart illustrating an incremental recompile in which the number of registers to be inserted into a path is automatically calculated by the EDA tool. In this alternative embodiment, the EDA tool automatically calculates the number of registers to insert in order to synchronize signal groups, rather than relying upon the user to choose the correct number of registers to insert. A first fitting is done with minimal registers for each signal path. Because long register-to-register routing paths can adversely affect F(max), extra registers are inserted. Next, each signal group is reviewed to see if all of its signals are synchronized, that is, the signals take the same number of clock cycles to reach the final output pin register. For those signals that arrive in a smaller number of cycles than the maximum in the group, extra registers are inserted. Once all groups are synchronized, the routing for the affected connections is recalculated and the synchronization for each group is double-checked. This process may take several iterations if routing resources are scarce due to high utilization by the original design.

The flow chart of FIG. 8 corresponds roughly to steps 230 and 232 (FIG. 7) of FIG. 6. That is, instead of a user choosing a number of registers and then performing an incremental recompile, the flow chart of FIG. 8 automatically calculates the correct number of registers in the context of the incremental recompile. In step 604, the user groups the selected signals of interest into synchronized groups, i.e., each group contains a group of signals that the user wishes to be synchronized. Such selection may be performed using the user interfaces of FIG. 4 or FIG. 9 or in any other suitable manner. In step 608, an incremental recompile is begun which includes steps 500 and 504. Steps 612, 616, 620 and 624 are performed, and preferably are implemented as are corresponding steps 510, 512, 520, 524 and 534.

Loop 628 iterates over each of the selected signals of interest. Because long register-to-register routing paths can adversely affect F(max), extra registers are inserted in particular signal paths in order to reduce these long routing paths. Preferably, a minimal number of registers needed to reduce a path length is used. In step 632, the inverse of the longest register-to-register path delay for a particular signal is compared to the original F(max). If the inverse is greater than F(max), then the path length is acceptable and the next signal is reviewed.

If not, then in step 636, a calculation is performed to determine the correct number of registers to insert into the path so that F(max) is not affected. This calculation is performed by comparing the estimated routing delay for the source to output pin connection and the current critical routing connection delay in the design, given by the inverse of the F(max). I.e., number of registers=ceil (estimated total source to output pin routing delay (ns)* $F(max)(ns^{-1})$)

Once all signals have been reviewed in loop 628, the loop ends.

Step 640 determines whether all groups have been synchronized. If so, then control moves to step 664 that will be explained below. If not, then control moves to loop 644 iterates over each synchronies group. A group is synchronized if each signal takes the same number of clock cycles to reach the final output pin register. For those signals that arrive in a smaller number of cycles, extra registers are inserted. Step 648 checks whether a group is synchronized, if so, then the next group is reviewed. If not, then in step 652 a calculation is performed and extra registers are inserted (i.e., into the logical netlist) into the signal path of the particular signals in the group that need further delay.

This calculation may be performed by an algorithm represented by the following pseudocode, although other algorithms may also be used.

```
While further fitting required {
  For each (synchronization group)
    if signals not synchronized {
      further fitting required
      Get maximum source to output delay in clock cycles, C_max
      For each signal in (synchronization group)
        Get current signal source to output delay in clock cycles,
          C if C < C_max {
            insert C_max − C further registers along path (between
              furthest apart registers) in logical netlist
          }
        end loop over signals
    }
  end loop over synchronization groups
  Remove existing routing for broken connections (where new
    registers have been inserted)
  Place new registers
  Route new connections
end while.
```

Once all groups have been reviewed, loop 648 ends. In step 656, the additional registers for the signals in the affected groups are placed, for example, as described in steps 524 and 534. Next, in step 660 the individual connections to which registers have been added are rerouted, for example, as described in steps 540 and 548. A routing netlist is created, an output file written, and a timing analysis performed in steps 664, 668 and 672, for example, as described in steps 556, 560 and 564.

Timing Report Table

FIG. 9 shows an example of a user interface 700 having a timing report table 716. Once a user has inserted registers where desired and has compiled a design, the timing report table provides a status for each source signal that has been routed to an output pin.

User interface screen 700 is one example of a user interface available when using an EDA tool to come up with an electronic design. Screen 700 includes a number of reports that a user may look at to assist with creating or debugging a design. Compilation report folder 704 includes a number of screens for viewing, including a timing analyzer folder 708 that includes a variety of information concerning the timing of the design. In this example, the user has chosen the source-to-output delay screen 712 that results in timing report table 716 appearing in a window.

Table 716 lists various signal routings, a status and a delay. Columns 730 and 732 list respectively a source name and a pin location for each routing and have been previously explained in FIG. 4. Column 734 lists a pin name corresponding to a particular pin location. The pin name is a reference name given to the output pin by the user, for example "My_Debug_Output_1", and the pin location specifies the physical placement of this pin on the device, for example "Pin_1", which has associated coordinates, I/O Bank etc.

Column 736 indicates whether a particular routing is enabled and has been previously explained in FIG. 4. Column 738 indicates the status of a particular connection from an internal source to an output pin. The word "routed" indicates that a particular source has been routed to an output pin. Other indicators in the status column may be:

| | |
|---|---|
| "Routed": | Connected and routed successfully in the netlist. |
| "Not Routed": | Not routed, as not enabled on last compile. |
| "Failed to Route": | Failed in last compile for some reason. |

Column 739 indicates either a delay or whether a particular routing has had additional registers inserted as per the present invention. For example, grouping 762 indicates in delay column 739 a particular delay from an internal source to an output pin. This delay number is useful for an engineer when debugging a design and in trying to decide whether or not to add additional registers to a particular routing. Grouping 764 indicates in delay column 739 that these particular signals are "registered," meaning that additional registers have been inserted into the path of this signal as per the present invention in order to attempt to synchronize these signals.

Signal 750 with a source name of "pin_00"is an example of an internal source that does not originate necessarily at the output of a register. In this example, "pin_00" is an input pin in the user's design. By viewing the timing report table, a user is able to confirm which internal signals have had additional registers inserted and or may view the exact delay from an internal source to an output pin.

Programmable Logic Development System

Figure 10:
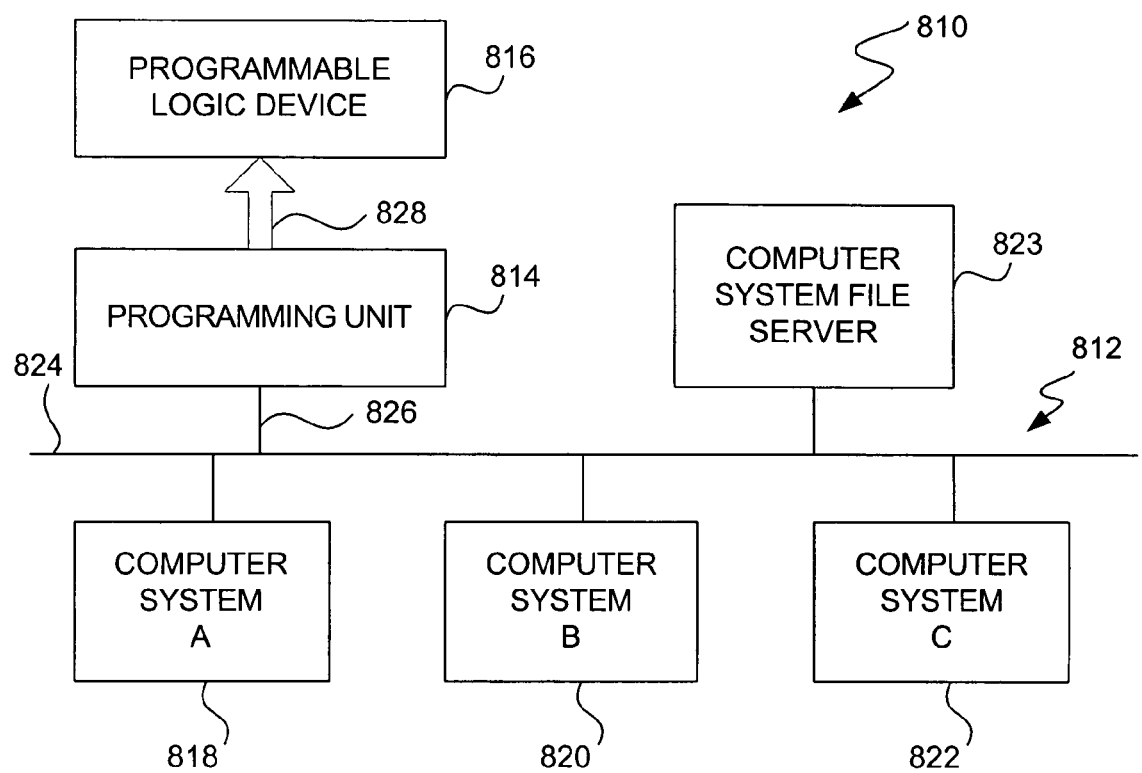
FIG. 10 is a block diagram of a programmable logic development system according to one embodiment of the present invention.
Figure 11:
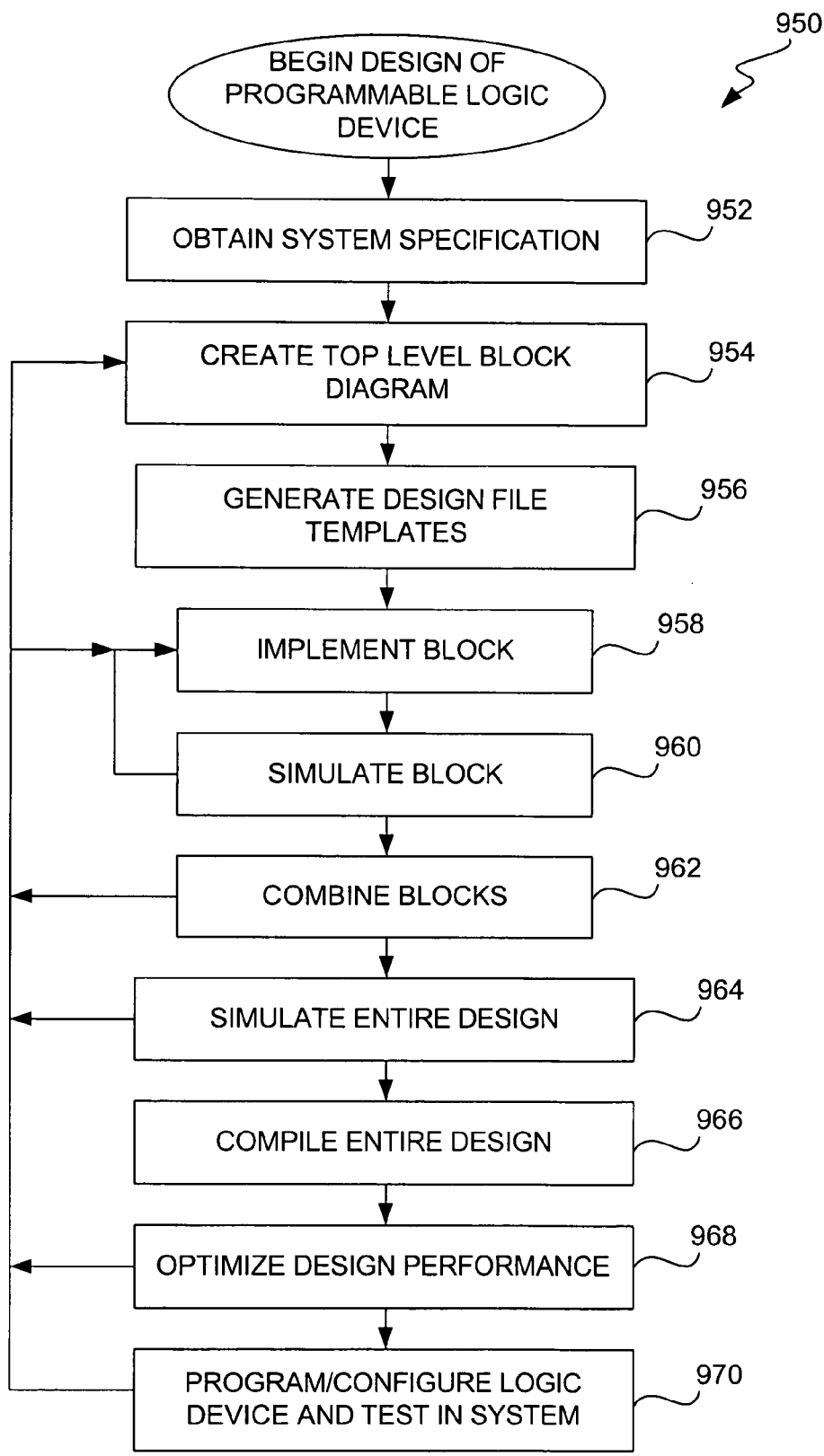
FIG. 11 is a flowchart of a design methodology used to design a programmable logic device according to one embodiment of the present invention.

FIGS. 10 and 11 illustrate an example of a programmable logic development system and a design methodology in which the present invention may be practiced.

FIG. 10 is a block diagram of an embodiment of a programmable logic development system 810 that includes a computer network 812, a programming unit 814 and a programmable logic device 816 that is to be programmed. Computer network 812 includes any number of computers connected in a network such as computer system A 818, computer system B 820, computer system C 822 and computer system file server 823 all connected together through a network connection 824. Computer network 812 is connected via a cable 826 to programming unit 814, which in turn is connected via a programming cable 828 to the PLD 816. Alternatively, only one computer system might be directly connected to programming unit 814. Furthermore, computer network 812 need not be connected to programming unit 814 at all times, such as when a design is being developed, but could be connected only when PLD 816 is to be programmed.

Programming unit 814 may be any suitable hardware programming unit that accepts program instructions from computer network 812 in order to program PLD 816. By way of example, programming unit 814 may include an add-on logic programmer card for a computer, and a master programming unit, such as are available from Altera Corporation of San Jose, Calif. PLD 816 may be present in a system or in a programming station. In operation, any number of engineers use computer network 812 in order to develop programming instructions using an electronic design automation (EDA) software tool. Once a design has been developed and entered by the engineers, the design is compiled and verified before being downloaded to the programming unit. The programming unit 814 is then able to use the downloaded design in order to program PLD 816.

For the purposes of debugging a PLD according to an embodiment of the present invention, any of the computers shown or others may be used by an engineer to compile a design. Furthermore, programming cable 828 may be used to receive data from the PLD, or a separate debugging cable may be used to directly connect a computer with device 816. Such a programmable logic development system is used to create an electronic design. A user creates a design by specifying and implementing functional blocks, as will now be described in the context of an exemplary design methodology.

FIG. 11 shows a design methodology 950 for using a system specification in order to develop a design with which to program a PLD. It should be appreciated that the present invention may be practiced in the context of a wide variety of design methodologies. By way of example, the techniques of the present invention work well by using an electronic design automation (EDA) software tool within the framework of this methodology.

In step 952 a system specification for the PLD to be programmed is obtained. This specification is an external document or file that describes, for example, the device pin names, the functionality of each of the pins, the desired system functionality, timing and resource budgets, and the like.

Once the system specification is obtained, creation of a design using functional block diagrams is begun. In step 954 a top-level block diagram is created in which connections between lower-level design blocks are specified. In this block, the target device, speed grade, and key timing requirements may be specified. Those skilled in the art will recognize that this top-level block may also include blocks that have already been developed or implemented or that have been obtained from a third party provider. This top-level block may also be converted into an HDL file, or the like, for use in other related design tools, such as an external simulator.

Step 956 includes generating design file templates with the EDA tool for all blocks present in the top-level block diagram of step 954. After the designer has created a block which has not yet been implemented, the system may generate a design file template. Such templates may display a block in a window format including, for example, a title or date around the boundaries. It may also include some details of the functional content depicted within the window. The design file templates may be in any specified design format including VHDL, AHDL, Verilog, block diagram, schematic, or other like format. In the case of a VHDL block the template may also include much of the formatting and necessary syntax for any VHDL block. The user need only take the template and add the small portion of VHDL syntax required to implement his function. Normal design, such as VHDL or other IEEE standard, requires large amounts of text to adequately set up the design block.

Those skilled in the art will recognize that design file templates such as these can be used as starting points for the design of the structural or functional entities needed by the design. Thus, a design file template may serve as a reusable object for different instances of a block in one or more designs. More importantly, design file templates will be employed to reduce the amount of labor that the designer must expend to generate the logic in the blocks. In one embodiment, the generation of the design file templates is done in such a way that the templates can be updated later if the top-level block diagram changes.

Next, in step 958, each of the blocks of the top-level block is implemented using the EDA tool. It is noted that for more complicated designs, there may be additional levels of block diagrams (i.e., blocks within blocks). If changes are required at the top-level then the top-level block diagram is updated and the sub-designs are preferably automatically updated as well.

Furthermore, a block may be compiled through to a fitting stage for a particular integrated circuit die to provide information about resource utilization, timing performance, etc., as required for a given design. As such, it is envisioned that some timing optimization may be performed during step 958. This sequence illustrates a style of design in which an engineer first designs, then compiles and simulates, and then returns to design again if the simulation results are not satisfactory. In another style, an engineer may iterate through a number of designs followed by simulation loops before finally compiling the complete design.

Concerning block implementation order, one or more of the following factors can be used to determine implementation order: (1) the complexity of a block; (2) the uncertainty or risk associated with a block; and/or (3) how far upstream and/or downstream in a given data-path the block resides. Each of steps 960, 962, 964, 968 and 970 may also lead back to this block implementation step 958 for additional implementation necessitated by later changes in the design.

In step 960 a block is simulated functionally at the source level using a behavioral simulator and vectors generated by using a VHDL or Verilog test bench, for example. The simulation results can then be displayed or otherwise presented or recorded as waveforms, text or annotated onto the source files. The designer may also return to step 958 to implement a block again. Also, at this point a block may be compiled or a timing analysis performed.

Once the designer is satisfied with the simulation results, in step 962 the block is combined with other blocks and the resulting group is simulated together. In some cases, it may be useful to complete a full compilation to provide critical resource and timing information. Also, output simulation vectors from one block may become the input simulation vectors to the next block. The designer may also return to step 954 to modify the top-level block or to step 958 to implement a block again.

Next, in step 964, the entire design is simulated functionally at the source level using a behavioral simulator. Preferably, the top-level block diagram is fully specified before simulation and shows complete design connectivity. Vectors can be generated using a VHDL or Verilog test bench. Again, the simulation results can be displayed either as waveforms or annotated onto the source files. The designer may also return to step 954 to modify the top-level block or to step 958 to implement a block again. In step 966 the entire design is compiled into a file containing the information needed to program a PLD to implement the user's design.

A wide variety of compile techniques may be used depending upon the type of design being created. By way of example, a few examples of compilation are presented below. For a PLD, compilation typically includes the steps of: initialization; database building; logic synthesis; technology mapping; fitting (placing and routing); assembly; and timing analysis. A simulation may also be performed as part of compilation or afterward. For a traditional integrated circuit design with a custom layout, compilation also includes a layout version schematic, a design rule checker and simulations. For integrated circuit design using a high level design tool, compilation includes synthesis from a language such as VHDL or Verilog, automatic fitting and simulations. For printed circuit boards, compilation includes automatic fitting, design rule checking, lumped parameter extraction and simulation. Of course, other types of compilation and variations on the above are possible.

Following compilation, in step 968 the designer determines if the performance goals for the design have been met by reference to the timing analysis and any simulation. In addition, other analysis tools such as a design profiler or a layout editor can be used to further optimize the design. Preferably, optimization is not performed prior to step 968 because full compilation is usually required to establish the location of one or more critical paths within the design. The designer may also return to step 954 to modify the top-level block or to step 958 to implement a block again.

Next, in step 970 the device is programmed using the programming unit and tested in the system. Again, the designer may also return to step 954 to modify the top-level block or to step 958 to implement a block again. While methodology 950 presents a top-down design process, it may also be used to support a bottom-up type methodology.

Computer System Embodiment

Figure 12A:
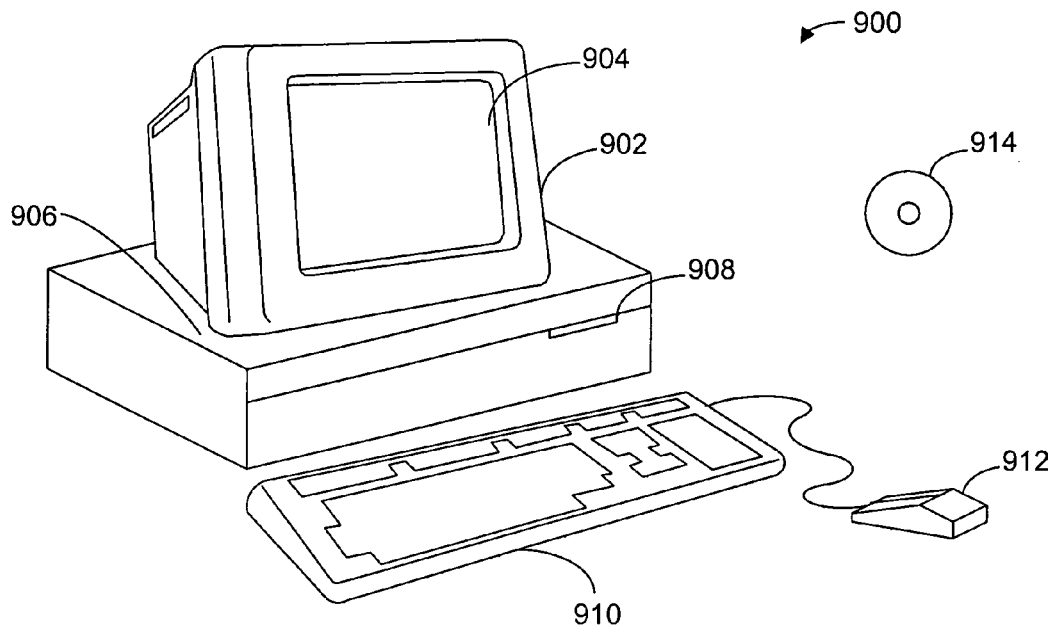
FIGS. 12A and 12B illustrate a computer system 900 suitable for implementing embodiments of the present invention.
Figure 12B:
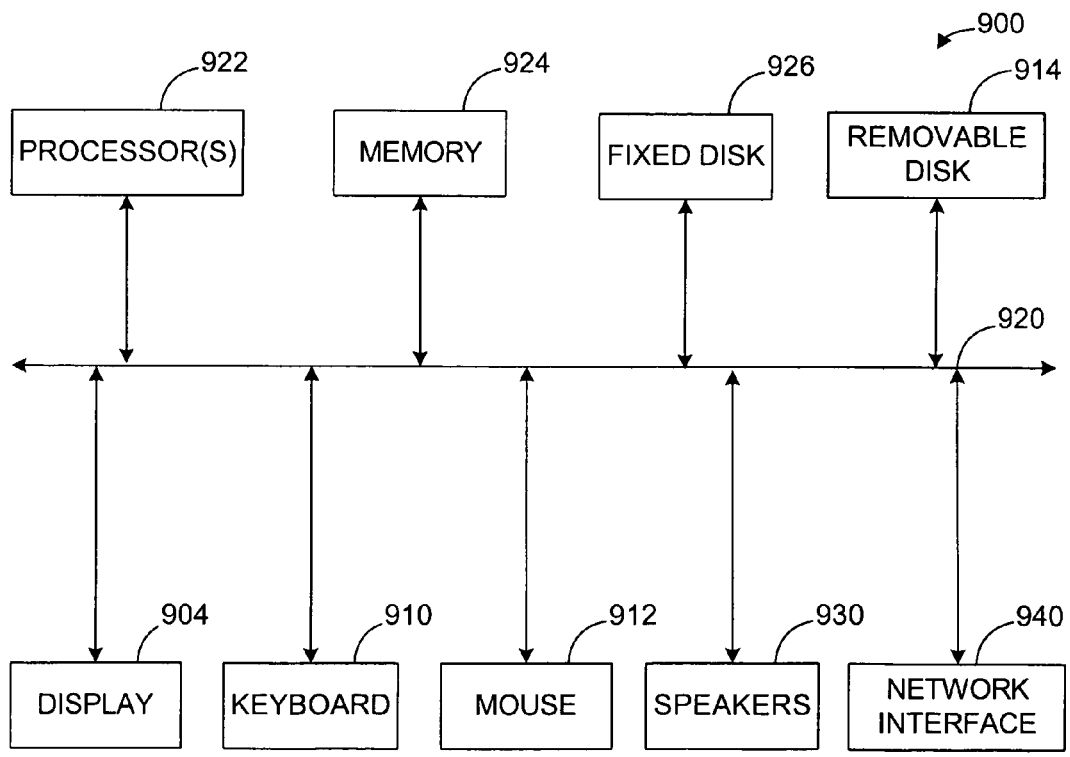

FIGS. 12A and 12B illustrate a computer system 900 suitable for implementing embodiments of the present invention. FIG. 12A shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 12B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. For instance, the invention is applicable to integrated circuits, and circuit boards as well as PLDs. Also, any number of internal signals may be chosen, and outputs may be rearranged to accommodate debugging. Therefore, the described embodiments should be taken as illustrative and not restrictive, and the invention should not be limited to the details given herein but should be defined by the following claims and their full scope of equivalents.

We claim:

1. A method of debugging an electronic design comprising:
   identifying a source of an internal signal of said electronic design to be viewed;
   identifying an output pin of said electronic design to which it is desired to route said internal signal;
   receiving a number indicating a quantity of registers to be inserted between said internal signal source and said output pin;
   performing a compile of said electronic design including compiling a routing from said internal signal source to said output pin via said quantity of registers; and
   producing an output file representing said electronic design as a result of said compile, said output file including an additional delay from said internal signal source to said output pin due to said quantity of registers.

2. A method as recited in claim 1 wherein said compile is an incremental recompilation, said method further comprising:
   performing a full compile of said electronic design prior to said incremental recompilation, wherein said incremental recompilation does not disturb the placement and routing resulting from said full compile.

3. A method as recited in claim 1 wherein said quantity of registers is received via user input.

4. A method as recited in claim 1 wherein said quantity of registers is received via software that automatically calculates said number.

5. A method as recited in claim 1 further comprising:
   identifying a clock signal to be used to trigger said registers.

6. A method as recited in claim 1 wherein said registers are flip flops, latches or more complex registers.

7. A method as recited in claim 1 further comprising:
   downloading said output file onto a PLD, whereby said compiled design may be tested on said PLD and said internal signal viewed at said output pin.

8. A method as recited in claim 1 wherein the recited steps of claim 1 are performed in a system using an electronic design automation (EDA) tool.

9. A method as recited in claim 1 wherein said electronic design is intended for a programmable logic device (PLD), a chip, or a circuit board.

10. A method of debugging an electronic design comprising:
    identifying a plurality of internal signals of said design to be viewed, each of said internal signals having a source;
    identifying a plurality of output pins of said design to which it is desired to route said internal signals, each of said signals being routed to one of said output pins;
    for each internal signal, receiving a number indicating a quantity of registers to be inserted between the internal signal source and its corresponding output pin;
    performing a compile of said electronic design including compiling a routing, for each internal signal, from said internal signal source to its corresponding output pin via said registers corresponding to said internal signal; and
    producing an output file representing said electronic design as a result of said compile, said routing of said output file arranged to synchronize said internal signals at said output pins due to said registers.

11. A method as recited in claim 10 wherein said compile is an incremental recompilation, said method further comprising:
    performing a full compile of said electronic design prior to said incremental recompilation, wherein said incremental recompilation does not disturb the placement and routing resulting from said full compile.

12. A method as recited in claim 10 wherein said quantity of registers for each internal signal is received via user input.

13. A method as recited in claim 10 wherein said quantity of registers for each internal signal is received via software that automatically calculates said number.

14. A method as recited in claim 10 further comprising:
    for each internal signal, identifying a clock signal to be used to trigger said registers corresponding to said internal signal.

15. A method as recited in claim 10 wherein said registers are flip flops, latches or more complex registers.

16. A method as recited in claim 10 further comprising:
    downloading said output file onto a PLD, wherein said compiled design is tested on said PLD and wherein said internal signals are synchronized at said output pins.

17. A method as recited in claim 10 wherein the recited steps of claim 10 are performed in a system using an electronic design automation (EDA) tool.

18. A method as recited in claim 10 wherein said electronic design is intended for a programmable logic device (PLD), a chip, or a circuit board.

19. A method as recited in claim 10 wherein said internal signals form a bus of said electronic design.

20. A method of performing an incremental recompile of an electronic design comprising:
   skipping the database building and logic synthesis stages of a full compilation;
   retrieving a logical and a routing netlist for said electronic design;
   receiving an internal signal name and an output pin name;
   creating a number of registers to insert between said internal signal and said output pin;
   connecting said internal signal to said output pin via said registers in said logical netlist; and
   placing and routing a connection from said internal signal to said output pin using said logical netlist and said routing netlist, thus producing a modified routing netlist; whereby said connection introduces an additional delay from said internal signal to said output pin due to said registers.

21. A method as recited in claim 20 further comprising:
   outputting said modified routing netlist into a programming output file (POF) in a form suitable for programming; and
   downloading said POF onto a PLD, whereby said electronic design may be tested and debugged on said PLD by viewing said internal signal at said output pin.

22. A method as recited in claim 20 wherein the recited steps of claim 20 are performed in a system by an electronic design automation (EDA) tool.

23. A method as recited in claim 20 wherein said electronic design is intended for a programmable logic device (PLD), a chip, or a circuit board.

24. A method as recited in claim 20 further comprising:
   performing a full compile of said electronic design prior to said incremental recompile, wherein said incremental recompilation does not disturb the placement and routing resulting from said full compile.

25. A method as recited in claim 20 wherein the quantity of said number of registers created is determined by user input.

26. A method as recited in claim 20 wherein the quantity of said number of registers created is determined by software that automatically calculates said quantity.

27. A method as recited in claim 20 further comprising:
   connecting a clock signal to be used to trigger said registers in said logical netlist.

28. A method as recited in claim 20 wherein said registers are flip flops, latches or more complex registers.

29. A method of debugging an electronic design comprising:
   selecting an internal signal of said electronic design to be viewed;
   selecting an output pin of said electronic design to which it is desired to route said internal signal;
   choosing a quantity of registers to be inserted between a source of said internal signal and said output pin;
   executing a compile of said electronic design including compiling a routing from said source internal signal to said output pin via said quantity of registers to produce a compiled electronic design; and
   downloading said compiled electronic design onto a PLD, whereby PLD includes an additional delay from said internal signal source to said output pin due to said quantity of registers.

30. A method as recited in claim 29 wherein said compile is an incremental recompilation, said method further comprising:
   performing a full compile of said electronic design prior to said incremental recompilation, wherein said incremental recompilation does not disturb the placement and routing resulting from said full compile.

31. A method as recited in claim 29 further comprising:
   identifying a clock signal to be used to trigger said registers.

32. A method as recited in claim 29 wherein said registers are flip flops, latches or more complex registers.

33. A method as recited in claim 29 wherein the recited steps of claim 29 are performed in a system using an electronic design automation (EDA) tool.

* * * * *